United States Patent
Tu et al.

(10) Patent No.: US 7,724,067 B1
(45) Date of Patent: May 25, 2010

(54) ENHANCED TRANSMISSION GATE

(75) Inventors: Cao-Thong Tu, Lausanne (CH); David Cousinard, Morges (CH)

(73) Assignee: Marvell International Ltd., Hamilton (BM)

( * ) Notice: Subject to any disclaimer, the term of this patent is extended or adjusted under 35 U.S.C. 154(b) by 328 days.

(21) Appl. No.: 11/729,471

(22) Filed: Mar. 29, 2007

Related U.S. Application Data

(60) Provisional application No. 60/797,276, filed on May 3, 2006.

(51) Int. Cl.
*H03K 17/687* (2006.01)

(52) U.S. Cl. .................................. 327/427; 327/581

(58) Field of Classification Search ............... None
See application file for complete search history.

(56) References Cited

U.S. PATENT DOCUMENTS

| | | | | |
|---|---|---|---|---|
| 4,529,897 A | * | 7/1985 | Suzuki et al. ............... 327/437 |
| 5,430,403 A | * | 7/1995 | Moyer et al. ................ 327/565 |
| 5,434,526 A | * | 7/1995 | Tanigashira et al. ......... 327/389 |
| 5,689,209 A | * | 11/1997 | Williams et al. ............ 327/425 |
| 5,703,522 A | * | 12/1997 | Arimoto et al. ............. 327/534 |
| 6,008,689 A | | 12/1999 | Au et al. |
| 6,424,203 B1 | * | 7/2002 | Bayadroun .................. 327/536 |
| 6,462,611 B2 | | 10/2002 | Shigehara et al. |
| 6,628,159 B2 | * | 9/2003 | Voldman .................... 327/534 |
| 6,859,089 B2 | * | 2/2005 | Farley ........................ 327/427 |
| 7,095,266 B2 | * | 8/2006 | Miske ........................ 327/427 |
| 7,129,766 B2 | * | 10/2006 | Steinhagen ................. 327/427 |
| 7,148,668 B1 | * | 12/2006 | Collins ....................... 323/282 |
| 7,385,433 B2 | * | 6/2008 | Callahan, Jr. ............... 327/534 |
| 7,477,499 B2 | * | 1/2009 | Mandai ........................ 361/58 |
| 7,554,382 B2 | * | 6/2009 | Miske et al. ................ 327/382 |

* cited by examiner

*Primary Examiner*—Cassandra Cox

(57) ABSTRACT

A body switch system includes a timing module that generates a plurality of clock signals, an input node that receives an input signal, an output node that transmits an output signal; and a body switch circuit that selectively couples a body of a first transistor of a plurality of transistors to one of the input node and the output node and a body of a second transistor of the plurality of transistors to the other one of the input node and the output node based on the plurality of clock signals.

47 Claims, 12 Drawing Sheets

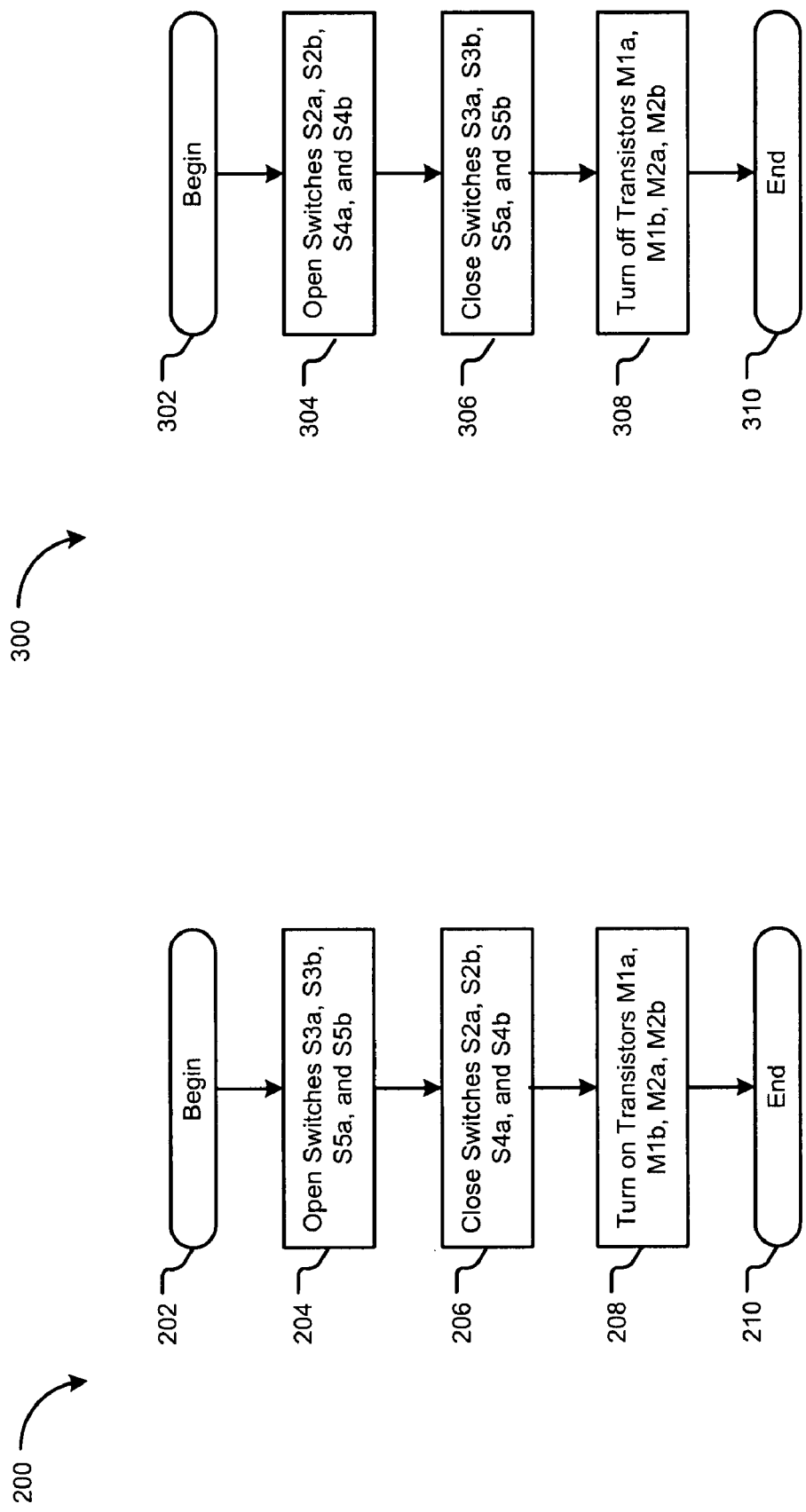

ENHANCED TRANSMISSION GATE

CROSS-REFERENCE TO RELATED APPLICATIONS

This application claims the benefit of U.S. Provisional Application No. 60/797,276, filed on May 3, 2006. The disclosure of the above application is incorporated herein by reference.

FIELD

The present disclosure relates generally to analog transmission gates, and more particularly to enhancing linear operation in analog transmission gates.

BACKGROUND

Metal oxide semiconductor field effect transistor (MOSFET) structures are used in many different analog circuits through the use of complimentary metal oxide semiconductor (CMOS) technology. For example, high speed/low power circuitry in low voltage applications requires reliable analog transmission gate structures. Analog transmission gates are used in digital CMOS circuit design as switches that selectively pass high level and low level logic signals.

Referring to FIG. 1, an exemplary transmission gate 10 includes an n-channel MOS (NMOS) transistor 12 and a p-channel MOS (PMOS) transistor 14. The NMOS transistor 12 and PMOS transistor 14 are connected in parallel and share a common source 16 and a common drain 18. A gate 20 of the NMOS transistor 12 is coupled to a clock signal (CLK) and a gate 22 of the PMOS transistor is coupled to an inverted clock signal (CLKbar). Conventionally, a body 24, or bulk, of the NMOS transistor 12 is connected to a ground potential and a body 26 of the PMOS transistor 14 is supplied with a supply voltage ($V_{DD}$).

The transmission gate 10 receives an input voltage ($V_{in}$) at the common source 16 and transmits an output signal ($V_{out}$) when activated. During operation at low voltages, the bodies, 24, 26 may experience a different potential than the common source 16.

SUMMARY

A body switch system includes a timing module that generates a plurality of clock signals, an input node that receives an input signal, an output node that transmits an output signal; and a body switch circuit that selectively couples a body of a first transistor of a plurality of transistors to one of the input node and the output node and a body of a second transistor of the plurality of transistors to the other one of the input node and the output node based on the plurality of clock signals.

In other features, the first transistor includes a source and a drain, the source and the drain of the first transistor are coupled to the input node and the output node, respectively, and the second transistor includes a source and a drain, the source and the drain of the second transistor are coupled to the input node and the output node, respectively. The body switch circuit alternately couples the body of the first transistor to a ground potential and the one of the input node and the output node using a plurality of switches and alternately couples the body of the second transistor to a supply voltage and the other one of the input node and the output node using the plurality of switches.

In other features, each of the plurality of switches and each of the plurality of transistors are operated based on the plurality of clock signals. The plurality of switches includes a first and a second set of switches and the plurality of transistors includes a first and a second set of primary transistors that correspond to the first set of switches and the second set of switches, respectively. Each of the first and second set of switches, respectively, includes an input node switch, an output node switch, and ground switches.

In other features, the ground switches turn off before the output node switches and the input node switches turn on. The first and second sets of primary transistors turn on after the input node switches and output node switches turn on. The output node switches and the input node switches turn off before the ground switches turn on. The first and second set of primary transistors turn off after the ground switches turn on.

In other features, the plurality of clock signals includes input clock signals and complementary input clock signals where the timing module generates the complementary input clock signals based on the input clock signals. The first set of primary transistors and the first set of switches are operated based on the input clock signals and the second set of primary transistors and the second set of switches are operated based on the complementary input clock signals.

In other features, the plurality of clock signals are generated based on a reference clock signal and wherein the timing module delays each of the plurality of clock signals relative to the reference clock signal. The plurality of transistors are one of a n-channel metal oxide semiconductor (NMOS) transistor and a p-channel metal oxide semiconductor (PMOS) transistor. The plurality of switches are one of a n-channel metal oxide semiconductor (NMOS) transistor and a p-channel metal oxide semiconductor (PMOS) transistor. The plurality of transistors are one of a n-channel metal oxide semiconductor (NMOS) transistor and a p-channel metal oxide semiconductor (PMOS) transistor. A sample and hold system includes the body switch system.

A body switch system includes timing means for generating a plurality of clock signals, input means for receiving an input signal, output means for transmitting an output signal, and body switch means for selectively coupling a body of a first transistor of a plurality of transistors to one of the input means and the output means and a body of a second transistor of the plurality of transistors to the other one of the input means and the output means based on the plurality of clock signals.

In other features, the first transistor includes a source and a drain, the source and the drain of the first transistor are coupled to the input means and the output means, respectively, and the second transistor includes a source and a drain, the source and the drain of the second transistor are coupled to the input means and the output means, respectively. The body switch means alternately couples the body of the first transistor to a ground potential and the one of the input means and the output means using a plurality of switches and alternately couples the body of the second transistor to a supply voltage and the other one of the input means and the output means using the plurality of switches.

In other features, each of the plurality of switches and each of the plurality of transistors are operated based on the plurality of clock signals. The plurality of switches includes a first and a second set of switches and the plurality of transistors includes a first and a second set of primary transistors that correspond to the first set of switches and the second set of switches, respectively. Each of the first and second set of switches, respectively, includes an input node switch, an output node switch, and ground switches.

In other features, the ground switches turn off before the output node switches and the input node switches turn on. The first and second sets of primary transistors turn on after the input node switches and output node switches turn on. The output node switches and the input node switches turn off before the ground switches turn on. The first and second set of primary transistors turn off after the ground switches turn on.

In other features, the plurality of clock signals includes input clock signals and complementary input clock signals where the timing means generates the complementary input clock signals based on the input clock signals. The first set of primary transistors and the first set of switches are operated based on the input clock signals and the second set of primary transistors and the second set of switches are operated based on the complementary input clock signals.

In other features, the plurality of clock signals are generated based on a reference clock signal and wherein the timing means delays each of the plurality of clock signals relative to the reference clock signal. The plurality of transistors are one of a n-channel metal oxide semiconductor (NMOS) transistor and a p-channel metal oxide semiconductor (PMOS) transistor. The plurality of switches are one of a n-channel metal oxide semiconductor (NMOS) transistor and a p-channel metal oxide semiconductor (PMOS) transistor. The plurality of transistors are one of a n-channel metal oxide semiconductor (NMOS) transistor and a p-channel metal oxide semiconductor (PMOS) transistor. A sample and hold system includes the body switch system.

A body switch method includes generating a plurality of clock signals, receiving an input signal, transmitting an output signal, and selectively coupling a body of a first transistor of a plurality of transistors to one of an input node and an output node and a body of a second transistor of the plurality of transistors to the other one of the input node and the output node based on the plurality of clock signals.

In other features, the first transistor includes a source and a drain, the source and the drain of the first transistor are coupled to the input node and the output node, respectively, and the second transistor includes a source and a drain, the source and the drain of the second transistor are coupled to the input node and the output node, respectively. The body switch method further comprising alternately coupling the body of the first transistor to a ground potential and the one of the input node and the output node using a plurality of switches and alternately coupling the body of the second transistor to a supply voltage and the other one of the input node and the output node using the plurality of switches.

In other features, each of the plurality of switches and each of the plurality of transistors are operated based on the plurality of clock signals. The plurality of switches includes a first and a second set of switches and the plurality of transistors includes a first and a second set of primary transistors that correspond to the first set of switches and the second set of switches, respectively. Each of the first and second set of switches, respectively, includes an input node switch, an output node switch, and ground switches.

In other features, the ground switches turn off before the output node switches and the input node switches turn on. The first and second sets of primary transistors turn on after the input node switches and output node switches turn on. The output node switches and the input node switches turn off before the ground switches turn on. The first and second set of primary transistors turn off after the ground switches turn on.

In other features, the plurality of clock signals includes input clock signals and complementary input clock signals where the complementary input clock signals are generated based on the input clock signals. The first set of primary transistors and the first set of switches are operated based on the input clock signals and the second set of primary transistors and the second set of switches are operated based on the complementary input clock signals.

In other features, the plurality of clock signals are generated based on a reference clock signal and wherein each of the plurality of clock signals is delayed relative to the reference clock signal. The plurality of transistors are one of a n-channel metal oxide semiconductor (NMOS) transistor and a p-channel metal oxide semiconductor (PMOS) transistor. The plurality of switches are one of a n-channel metal oxide semiconductor (NMOS) transistor and a p-channel metal oxide semiconductor (PMOS) transistor. The plurality of transistors are one of a n-channel metal oxide semiconductor (NMOS) transistor and a p-channel metal oxide semiconductor (PMOS) transistor. A sample and hold method includes the body switch method.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 7 is a flow diagram illustrating steps of a method for activating the body switch circuit according to the present disclosure;

FIG. 8 is a flow diagram illustrating steps of a method for deactivating the body switch circuit according to the present disclosure;

DETAILED DESCRIPTION

Figure 1:
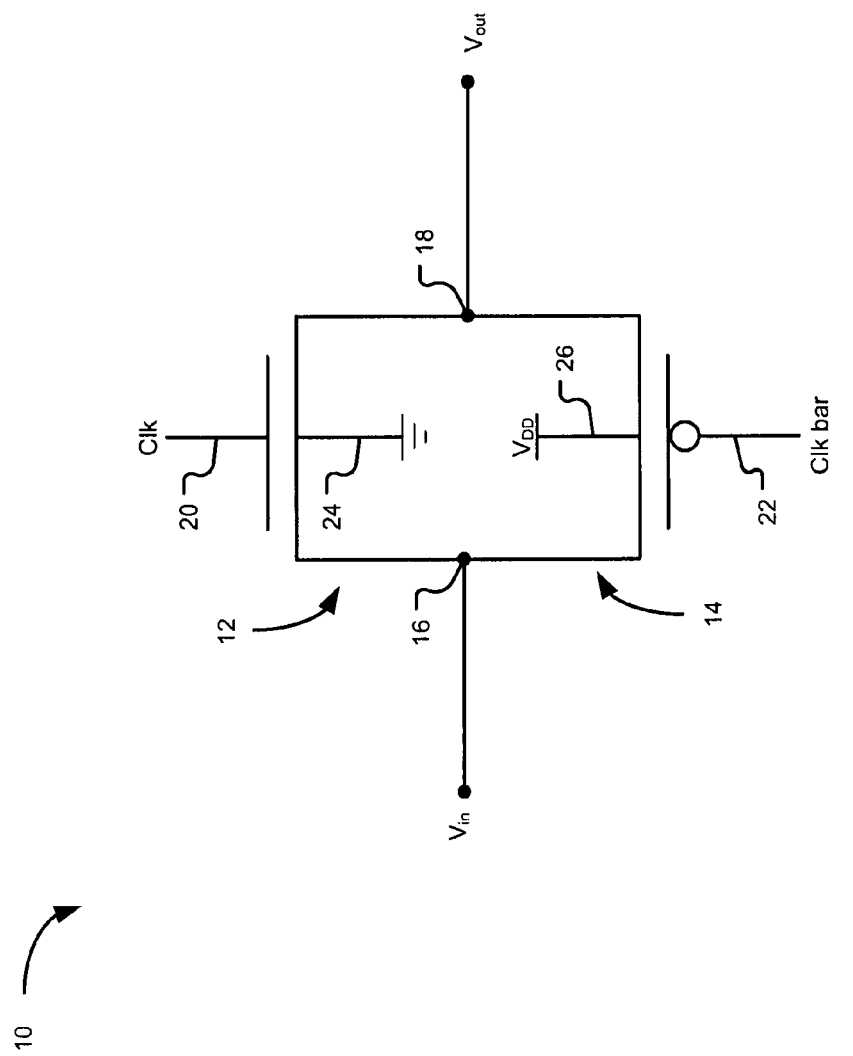
FIG. 1 is a functional block diagram of a transmission gate according to the prior art.

The following description is merely exemplary in nature and is in no way intended to limit the disclosure, its application, or uses. For purposes of clarity, the same reference numbers will be used in the drawings to identify similar elements. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 2:
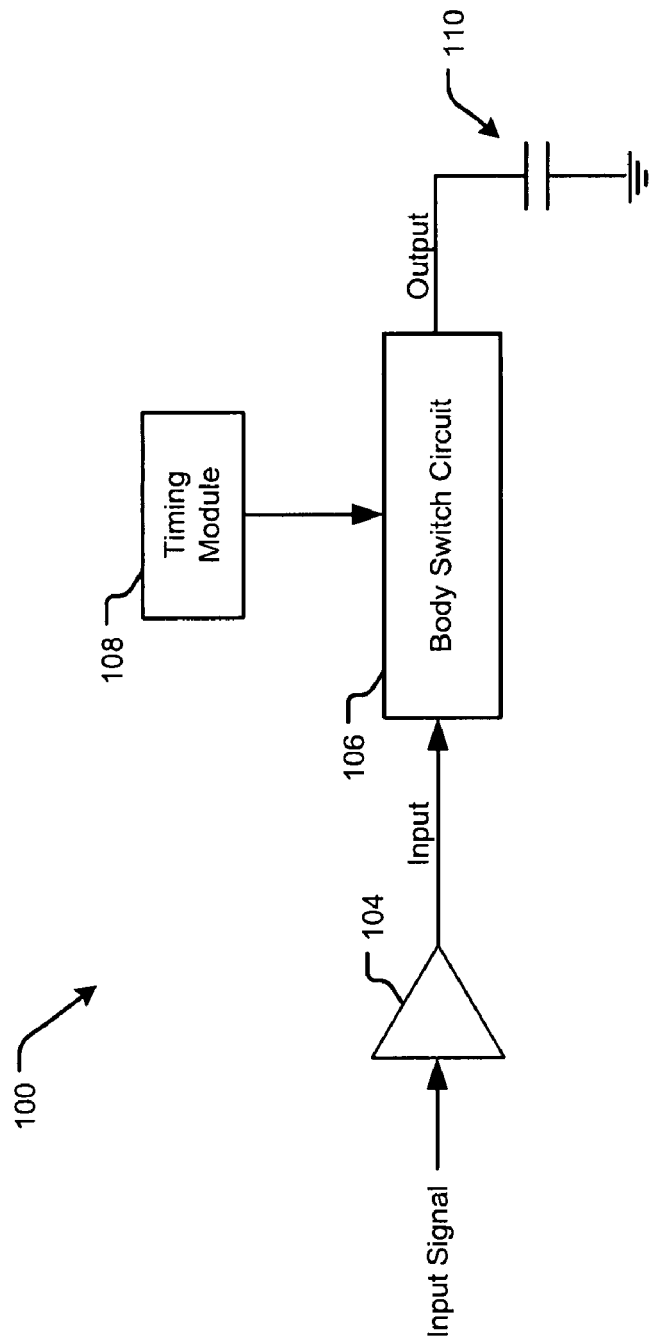
FIG. 2 is a functional block diagram of an exemplary sample and hold system according to the present disclosure.

Referring now to FIG. 2, an exemplary sample-and-hold system 100 that implements the body switch system is shown to include a low impedance buffer 104, a body switch circuit 106, a timing module 108, and a capacitor 110. Those skilled in the art can appreciate that various other implementations of the body switch system are contemplated within digital complementary metal oxide semiconductor (CMOS) processes.

The body switch circuit 106 receives an input signal (e.g. an input signal from an analog device). The low impedance buffer 104 isolates the body switch circuit 106. The body switch circuit 106 communicates with the low impedance buffer 104 and the timing module 108. The timing module 108 generates various clock signals that activate the body switch circuit 106. The body switch circuit 106 regulates the transmission of the input signal to the capacitor 110 (as an output signal) based on the various clocks signals generated by the timing module 108. The capacitor 110 stores the output signal transmitted from the body switch circuit 106.

Figure 3:
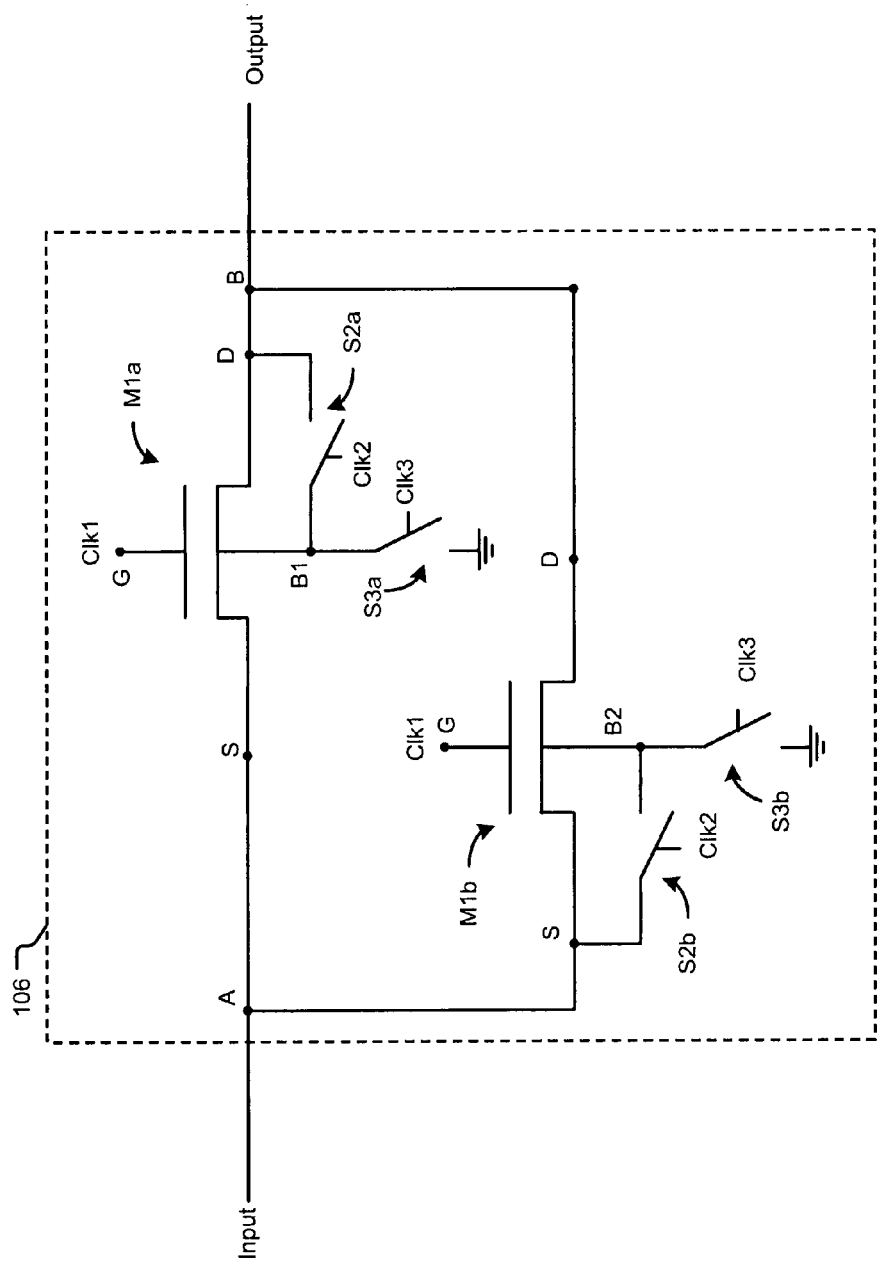
FIG. 3 is a functional block diagram of a body switch circuit according to the present disclosure.

Referring now to FIG. 3, a first implementation of the body switch circuit 106 is shown in more detail. The body switch circuit 106 implements the body switch system. The body switch circuit 106 includes a first set of primary metal oxide semiconductor (MOS) transistors M1a, M1b. In the present implementation, transistors M1a, M1b are n-channel MOS (NMOS) transistors, although other types of transistors are contemplated. The respective source and drain of the transistors M1a, M1b are coupled to each other at a common input node A and a common output node B, respectively. The input signal is supplied to the input node A. The body switch circuit 106 transmits the output signal at the output node B.

A body (B1) of the transistor M1a is coupled to the drain of the transistor M1A and a ground potential via switches S2a and S3a, respectively. A body (B2) of the transistor M1b is coupled to the source of the transistor M1b and a ground potential via switches S2b and S3b, respectively. In other words, the bodies B1 and B2 of the body switch circuit 106 are tied to voltages present at the output node B and the input node A, respectively, when the corresponding switches S2a and S2b are turned on. In the present embodiment, the switches S2a, S2b, S3a, and S3b, referred to collectively as a first set of secondary switches, are NMOS transistors. Those skilled in the art can appreciate that various other types of the first set of secondary switches are contemplated.

Input clock signals (Clk1, Clk2, and Clk3), referred to collectively as the input clock signals, drive transistors M1a and M1b, switches S2a and S2b, and switches S3a and S3b, respectively. For example, transistor M1a is turned on or off based on the Clk1. The transistor M1a receives the Clk1 at a gate (G) of the transistor M1a. Similarly, the transistor M1b and each of the first set of secondary switches are turned on or off based on input clock signals received at their respective gates. In the present implementation, the timing module 108 generates the input clock signals.

Figure 4:
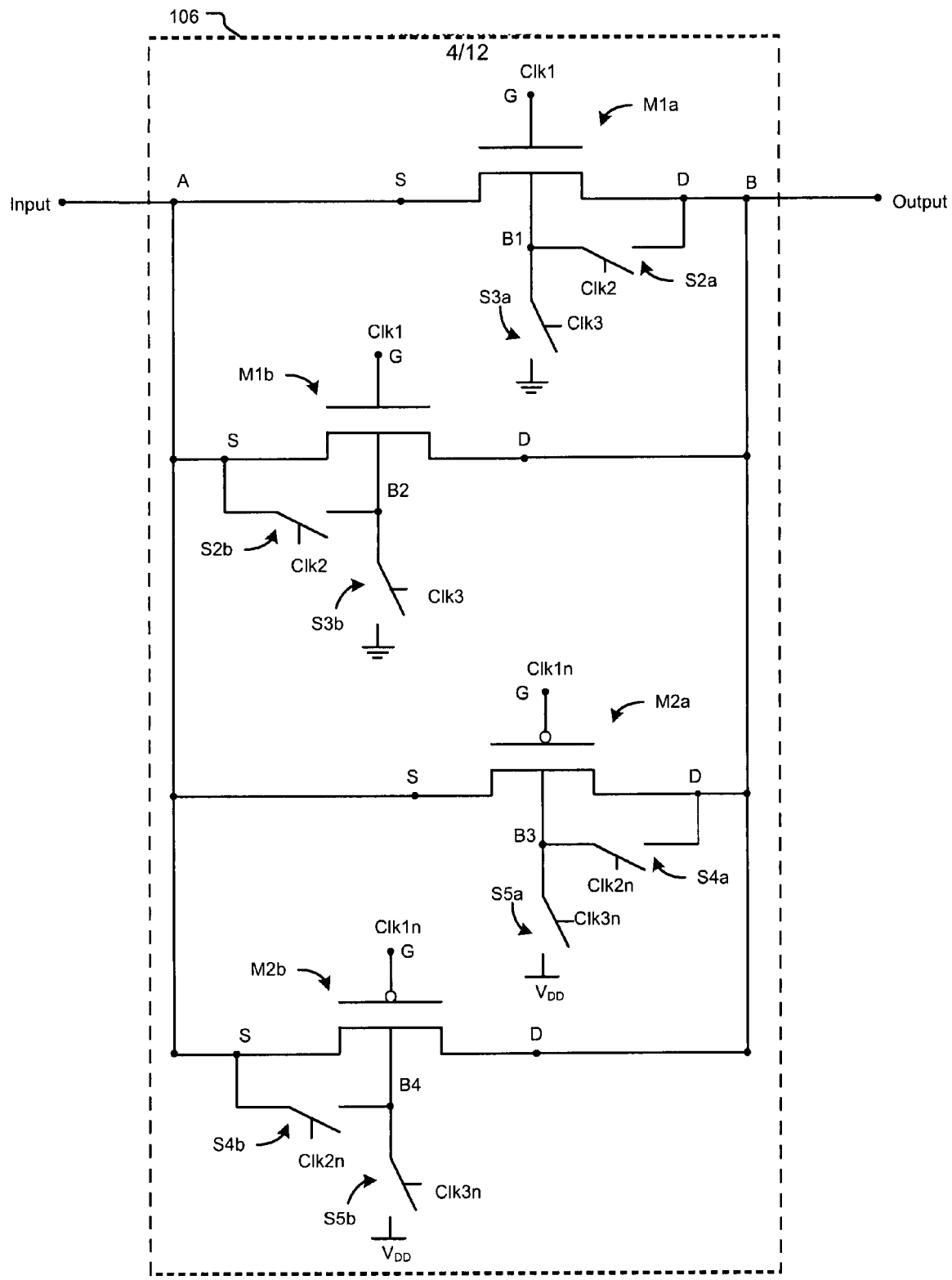
FIG. 4 is a functional block diagram of the body switch circuit according to the present disclosure.

Referring now to FIGS. 3 and 4, a second implementation of the body switch circuit 106 is shown. In FIG. 4, the body switch circuit 106 further includes a second set of primary MOS transistors M2a, M2b. In the present implementation, transistors M2a, M2b are p-channel MOS (PMOS) transistors, although other types of transistors are contemplated. The transistors M2a, M2b enable the body switch circuit 106 to transmit input signals having a low voltage level (e.g. 1.2 Volts). Similar to transistors M1a, M1b, the respective sources and drains of the transistors M2a, M2b are coupled to each other at the common input node A and the common output node B, respectively. Therefore, a voltage potential at the input node A is common among the sources of the transistors M1a, M1b, M2a, and M2b, and a voltage potential at the output node B is common among all the drains of the transistors M1a, M1b, M2a, and M2b.

A body (B3) of the transistor M2a is coupled to the drain of transistor M2a and a supply voltage ($V_{DD}$) via switches S4a and S5a, respectively. A body (B4) of the transistor M2b is coupled to the source of the transistor M2b and the $V_{DD}$ via switches S4b and S5b, respectively. In other words, the bodies B3 and B4 of the body switch circuit 106 are tied to voltages present at the output node B and the input node A, respectively, when the corresponding switches S4a and S4b are turned on. In the present embodiment, the switches S4a, S4b, S5a, and S5b, referred to collectively as a second set of secondary switches, are PMOS transistors. Those skilled in the art can appreciate that various other types of the second set of secondary switches are contemplated.

The body switch circuit 106 includes a symmetric configuration by coupling the bodies B1 and B2 of the body switch circuit 106 to the output node B and the input node A, respectively. The symmetric configuration of the body switch circuit 106 improves the linearity of the direct current (DC) output of the body switch circuit 106, thereby enhancing the operation of high speed networks operating in low voltage applications.

Complementary input clock signals (Clk1n, Clk2n, and Clk3n), referred to collectively as the complementary input clock signals, are complements, or inversions, of the Clk1, Clk2, and Clk3, respectively. The Clk1n, Clk2n, and Clk3n drive the transistors M2a and M2b, the switches S4a and S4b, and the switches S5a and S5b, respectively. For example, the transistor M2a is turned on or off based on the Clk1n. The transistor M2a receives the Clk1n at a gate (G) of the transistor M2a. Similarly, the transistor M2b and each of the second set of secondary switches are turned on or off based on the complementary input clock signals received at their respective gates.

The transistors M1a, M1b enable the body switch circuit 106 to transmit input signals having a low voltage level (e.g. a supply voltage of the body switch circuit 106) while the transistors M2a, M2b enable the body switch circuit 106 to transmit input signals having a high voltage level (e.g. 1.2 Volts). For example, an input signal having a voltage level of approximately the same magnitude of an input clock signal may form a weak inversion region within the transistors M1a, M1b whereas PMOS transistors (e.g. M2a, M2b), would form a strong inversion region.

Figure 5:
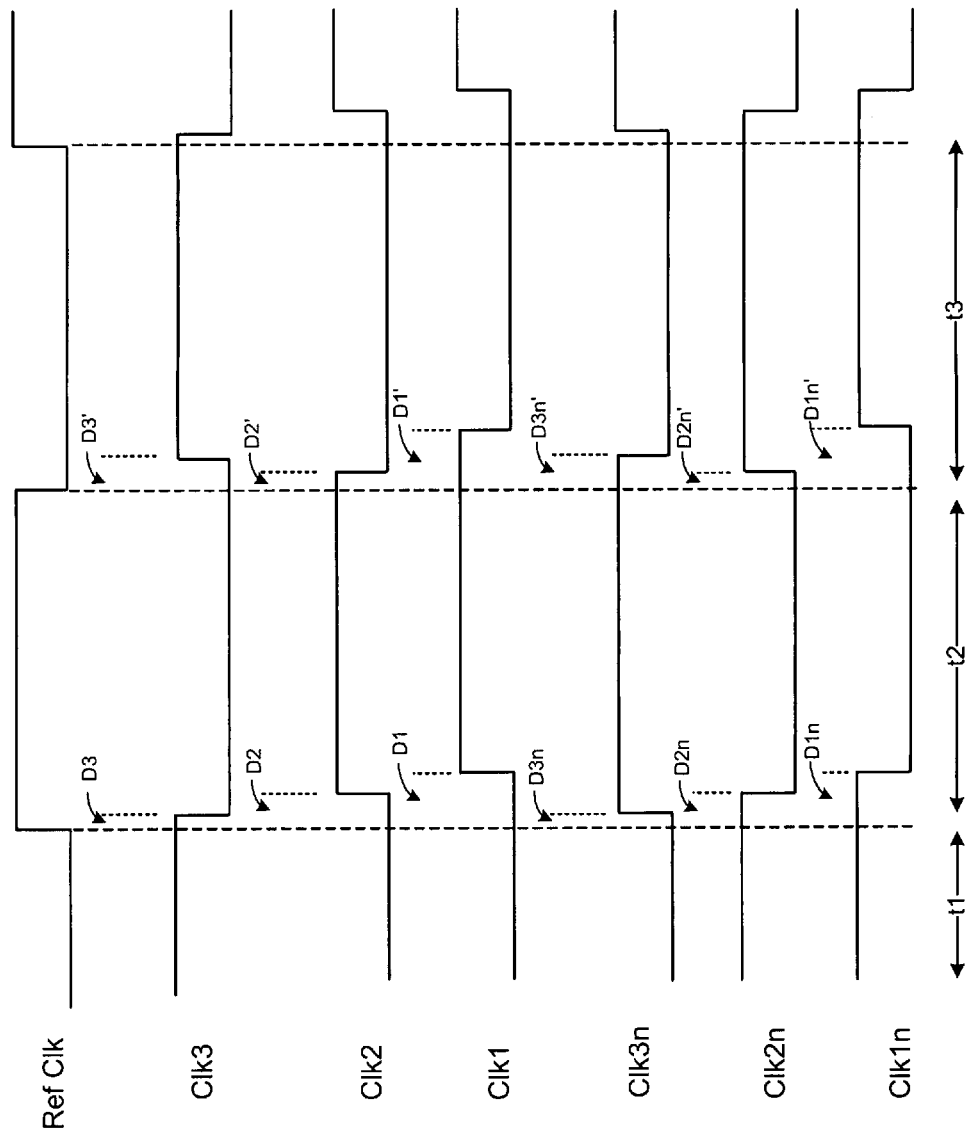
FIG. 5 is a timing diagram illustrating the operation of the body switch circuit according to the present disclosure.

Now referring to FIG. 5, an exemplary timing diagram illustrates the operation of the body switch circuit 106 depicted in FIG. 4. Those skilled in the art will appreciate that various other timing operations of the body switch circuit 106 are contemplated. The input clock signals and the complementary clock signals are based on a reference clock signal (Ref Clk). During a first time period (t1), the Clk1, Clk2 operate at a "low" voltage level and, the Clk3 operates at a "high" voltage level. In the present implementation, the high level includes, but is not limited to, the $V_{DD}$, and the low level includes, but is not limited to, a ground potential. Conversely, during the t1, the Clk1n, Clk2n are "high" and, the Clk3n is "low". In other words, the transistors M1a, M1b, M2a, and M2b and the switches S2a, S2b, S4a, S4b are turned off ("open") and in a non-conducting state. Switches S3a, S3b, S5a, and S5b are turned on ("closed") thereby coupling the B1 and B2 to ground and B3 and B4 to the $V_{DD}$ at the t1.

During a second time period (t2), the Clk3 falls to the low voltage level and the Clk1, Clk2 rise to the high voltage level. Conversely, the Clk3n rises to the high voltage level and the Clk1n, Clk2n fall to the low voltage level. As depicted in FIG. 5, when transitioning from t1 to t2, the timing module 108 delays the Clk1 and Clk1n, the Clk2 and Clk2n, and the Clk3 and Clk3n with respect to the Ref Clk by time delays D1 and D1n, D2 and D2n, and D3 and D3n, respectively. The D1, D1n, D2, D2n, D3, and D3n are referred to collectively as, the first time delays. In the present implementation, the D1, D1n exceed the D2, D2n as well as the D3, D3n, and the D2, D2n exceed the D3, D3n. In other embodiments, the first time delays can be varied. For example, the D1, D1n and D2, D2n, respectively, can be equivalent.

During t2, the switches S3a, S3b, S5a, and S5b are turned off. The transistors M1a, M1b, M2a, and M2b and the switches S2a, S2b, S4a, S4b are turned on and in a conducting state, resulting in the B1, B2, B3, and B4 being coupled to the drain or source of their respective transistors. In other words, the sources of the transistors M1a, M1b, M2a, and M2b are coupled to the input node A and the drains of the transistors M1a, M1b, M2a, and M2b are coupled to the output node B while the transistors conduct, thereby enhancing the linearity of body switch circuit 106.

During a third time period (t3), the Clk3 rises to the high voltage level and the Clk1, Clk2 fall to the low voltage level. The Clk3n falls to the low voltage level and the Clk1n, Clk2n rise to the high voltage level. When transitioning from t2 to t3, the timing module 108 delays the Clk1 and Clk1n, the Clk2 and Clk2n, and the Clk3 and Clk3n with respect to the Ref Clk by time delays D1' and D1n', D2' and D2n', and D3' and D3n', respectively. D1', D1n', D2', D2n', D3' and D3n' are referred to collectively as second time delays. During t3, the transistors Mia, M1b, M2a, and M2b and the switches S2a, S2b, S4a, and S4b return to the non-conducting state, and the switches S3a, S3b, S5a, and S5b are turned on, as in t1.

The first and second time delays assist in the operation of the body switch circuit 106 by avoiding connections to the bodies of the primary transistors that would degrade performance. For example, the delays D2, D2n exceed the delays D3, D3n so that switches S3a, S3b open before switches S2a, S2b close to avoid a short circuit to a ground potential.

Figure 6:
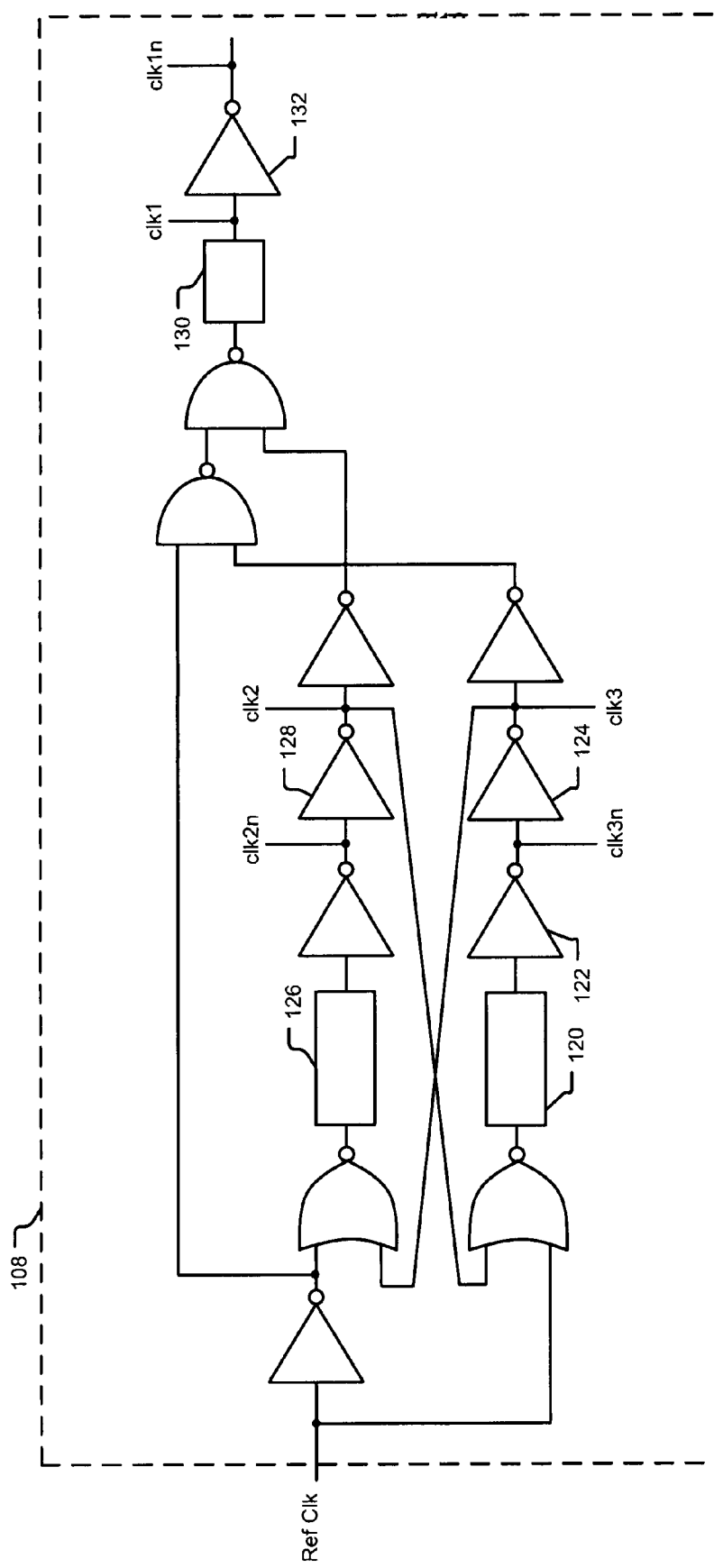
FIG. 6 is a functional block diagram of a timing module according to the present disclosure.

Referring now to FIG. 6, an exemplary timing module 108 is shown in more detail. Those skilled in the art will appreciate that various other implementations of the timing module 108 are contemplated. In the present implementation, the timing module 108 includes a plurality of logic and delay components. Those skilled in the art can appreciate that various other implementations of the timing module 108 are contemplated.

The input clock signals and complementary input clock signals are based on the Ref Clk. The timing module 108 receives the Ref Clk signal and transmits the Ref Clk through a plurality of logic and delay components to generate the input clock signals and complementary input clock signals.

For example, a delay module 120 generates a first delayed signal based on the Ref Cl and transmits the first delayed signal to an inverter 122. The inverter 120 outputs the Clk3n. An inverter 124 outputs the Clk3 based on the Clk3n. Similarly, the timing module 108 generates the Clk2n based on the Ref Clk and the Clk3 and by using a delay module 126. An inverter 128 outputs Clk2 based on the Clk2n. The timing module 108 generates the Clk1 based on at least one of the Ref Clk, Clk1, and Clk2. A delay module 130 outputs the Clk1 that is then transmitted to an inverter 132. The inverter 132 outputs the Clk1n. In the present implementation, the delay module 122 generates the D1, D1n, D1', and D1n'. The delay module 126 generates the D2, D2n, D2', and D2n'. Similarly, the delay module 130 generates the D3, D3n, D3', and D3n'.

Referring now to FIG. 7, an exemplary method 200 for activating the body switch system is shown in more detail. The method 200 begins at step 202. In step 204, the switches S3a, S3b, S5a, and S5b are opened thereby decoupling the B1 and B2, respectively, from ground potentials and decoupling B3 and B4, respectively, from the supply voltage. In step 206, switches S2a, S2b, S4a, and S4b close. The switches S2a and S4a respectively couple the B1 and B3 to the output node B. The switches S2b and S4b respectively couple the B2 and B4 to the input node A.

In step 208, the transistors M1a, M1b, M2a, and M2b are turned on. In various embodiments, step 206 and step 208 can be executed simultaneously. In step 210 the method 200 ends.

Referring now to FIG. 8, an exemplary method 300 for deactivating the body switch system is shown in more detail. The method 300 begins at step 302. In step 304, the switches S2a, S4a and S2b, S4b are opened thereby respectively decoupling the B1, B3 and the B2, B4 from the output node and the input node, respectively. In step 306, the switches S3a, S3b, S5a, and S5b close thus coupling B1 and B2, respectively, to ground potentials and coupling B3 and B4, respectively, to the supply voltage. In step 308, the transistors M1a, M1b, M2a, and M2b are turned off. In step 310 the method 300 ends.

Referring now to FIGS. 9A-9G, various exemplary implementations incorporating the teachings of the present disclosure are shown.

Figure 9A:
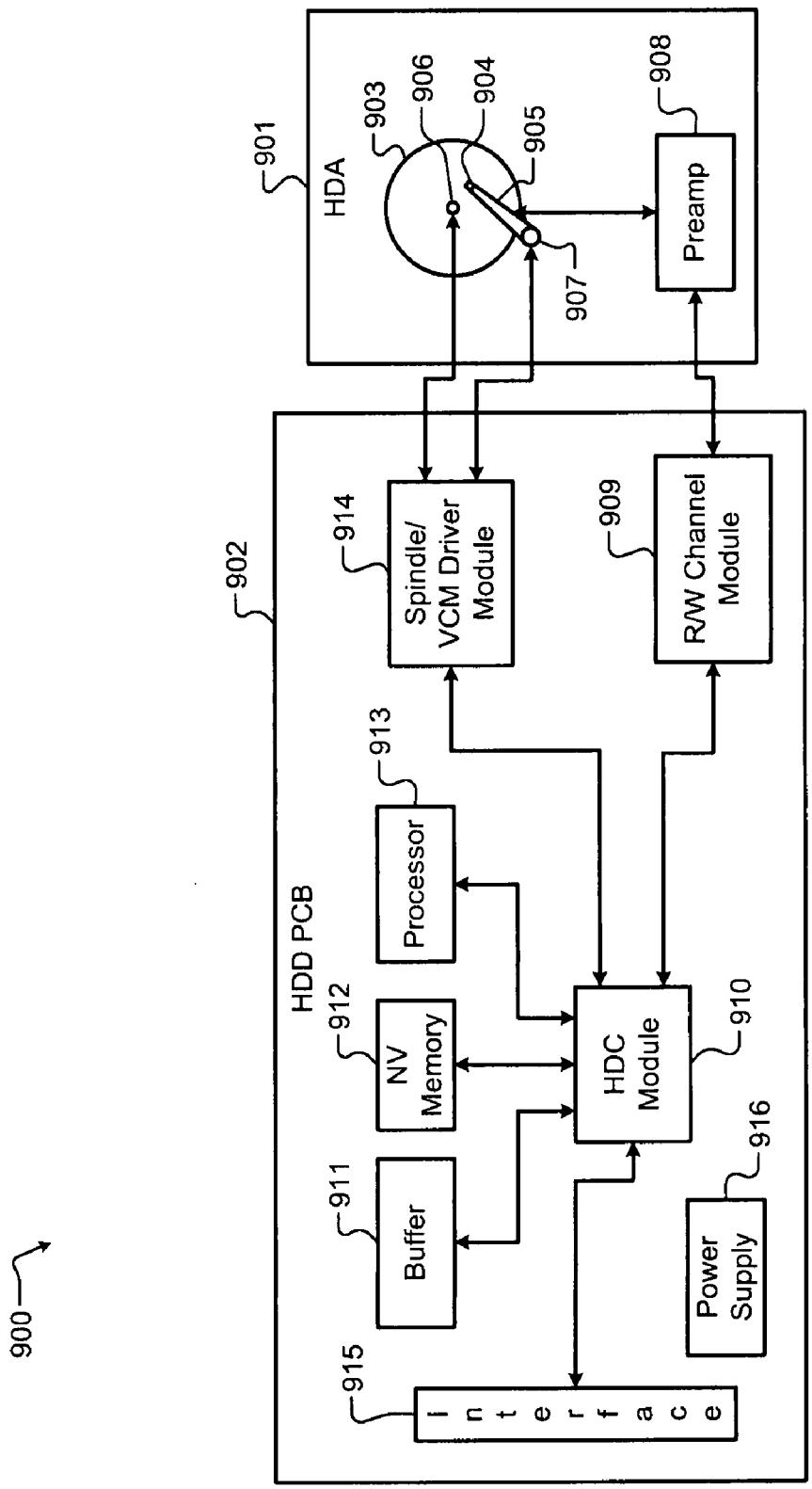
FIG. 9A is a functional block diagram of a hard disk drive.

Referring now to FIG. 9A, the teachings of the disclosure can be implemented in a R/W channel module 909 of a hard disk drive (HDD) 900. The HDD 900 includes a hard disk assembly (HDA) 901 and a HDD PCB 902. The HDA 901 may include a magnetic medium 903, such as one or more platters that store data, and a read/write device 904. The read/write device 904 may be arranged on an actuator arm 905 and may read and write data on the magnetic medium 903. Additionally, the HDA 901 includes a spindle motor 906 that rotates the magnetic medium 903 and a voice-coil motor (VCM) 907 that actuates the actuator arm 905. A preamplifier device 908 amplifies signals generated by the read/write device 904 during read operations and provides signals to the read/write device 904 during write operations.

The HDD PCB 902 includes the read/write channel module (hereinafter, "read channel") 909, a hard disk controller (HDC) module 910, a buffer 911, nonvolatile memory 912, a processor 913, and a spindle/VCM driver module 914. The read channel 909 processes data received from and transmitted to the preamplifier device 908. The HDC module 910 controls components of the HDA 901 and communicates with an external device (not shown) via an I/O interface 915. The external device may include a computer, a multimedia device, a mobile computing device, etc. The I/O interface 915 may include wireline and/or wireless communication links.

The HDC module 910 may receive data from the HDA 901, the read channel 909, the buffer 911, nonvolatile memory 912, the processor 913, the spindle/VCM driver module 914, and/or the I/O interface 915. The processor 913 may process the data, including encoding, decoding, filtering, and/or formatting. The processed data may be output to the HDA 901, the read channel 909, the buffer 911, nonvolatile memory 912, the processor 913, the spindle/VCM driver module 914, and/or the I/O interface 915.

The HDC module 910 may use the buffer 911 and/or nonvolatile memory 912 to store data related to the control and operation of the HDD 900. The buffer 911 may include DRAM, SDRAM, etc. The nonvolatile memory 912 may include flash memory (including NAND and NOR flash memory), phase change memory, magnetic RAM, or multi-state memory, in which each memory cell has more than two states. The spindle/VCM driver module 914 controls the spindle motor 906 and the VCM 907. The HDD PCB 902 includes a power supply 916 that provides power to the components of the HDD 900.

Figure 9B:
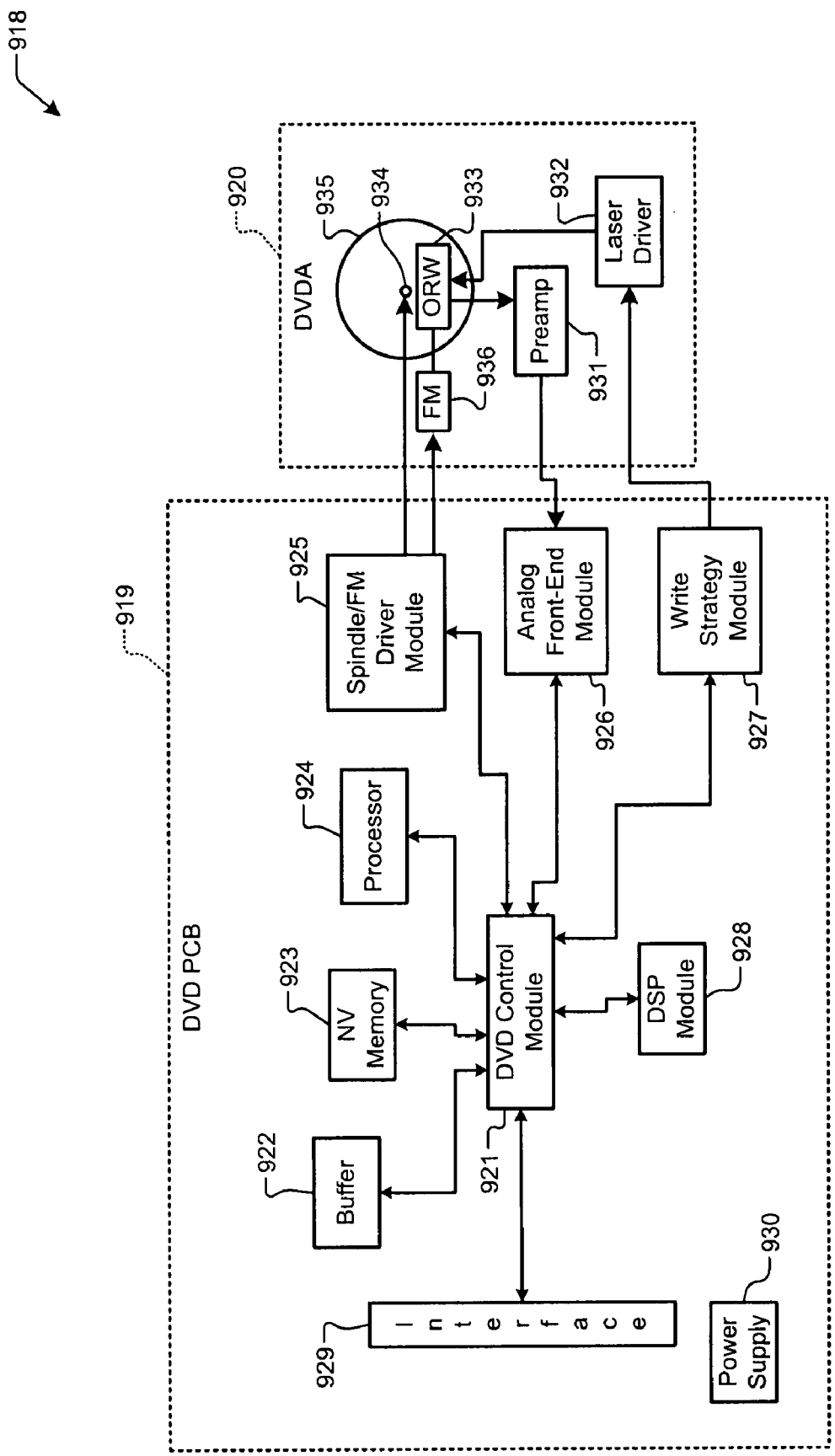
FIG. 9B is a functional block diagram of a DVD drive.

Referring now to FIG. 9B, the teachings of the disclosure can be implemented in an analog front-end module 926 of a DVD drive 918 or of a CD drive (not shown). The DVD drive 918 includes a DVD PCB 919 and a DVD assembly (DVDA) 920. The DVD PCB 919 includes a DVD control module 921, a buffer 922, nonvolatile memory 923, a processor 924, a spindle/FM (feed motor) driver module 925, the analog front-end module 926, a write strategy module 927, and a DSP module 928.

The DVD control module 921 controls components of the DVDA 920 and communicates with an external device (not shown) via an I/O interface 929. The external device may include a computer, a multimedia device, a mobile computing device, etc. The I/O interface 929 may include wireline and/or wireless communication links.

The DVD control module 921 may receive data from the buffer 922, nonvolatile memory 923, the processor 924, the spindle/FM driver module 925, the analog front-end module 926, the write strategy module 927, the DSP module 928, and/or the I/O interface 929. The processor 924 may process the data, including encoding, decoding, filtering, and/or formatting. The DSP module 928 performs signal processing, such as video and/or audio coding/decoding. The processed data may be output to the buffer 922, nonvolatile memory 923, the processor 924, the spindle/FM driver module 925, the analog front-end module 926, the write strategy module 927, the DSP module 928, and/or the I/O interface 929.

The DVD control module 921 may use the buffer 922 and/or nonvolatile memory 923 to store data related to the control and operation of the DVD drive 918. The buffer 922 may include DRAM, SDRAM, etc. The nonvolatile memory 923 may include flash memory (including NAND and NOR flash memory), phase change memory, magnetic RAM, or multi-state memory, in which each memory cell has more than two states. The DVD PCB 919 includes a power supply 930 that provides power to the components of the DVD drive 918.

The DVDA 920 may include a preamplifier device 931, a laser driver 932, and an optical device 933, which may be an optical read/write (ORW) device or an optical read-only (OR) device. A spindle motor 934 rotates an optical storage medium 935, and a feed motor 936 actuates the optical device 933 relative to the optical storage medium 935.

When reading data from the optical storage medium 935, the laser driver provides a read power to the optical device 933. The optical device 933 detects data from the optical storage medium 935, and transmits the data to the preamplifier device 931. The analog front-end module 926 receives data from the preamplifier device 931 and performs such functions as filtering and ND conversion. To write to the optical storage medium 935, the write strategy module 927 transmits power level and timing information to the laser driver 932. The laser driver 932 controls the optical device 933 to write data to the optical storage medium 935.

Figure 9D:
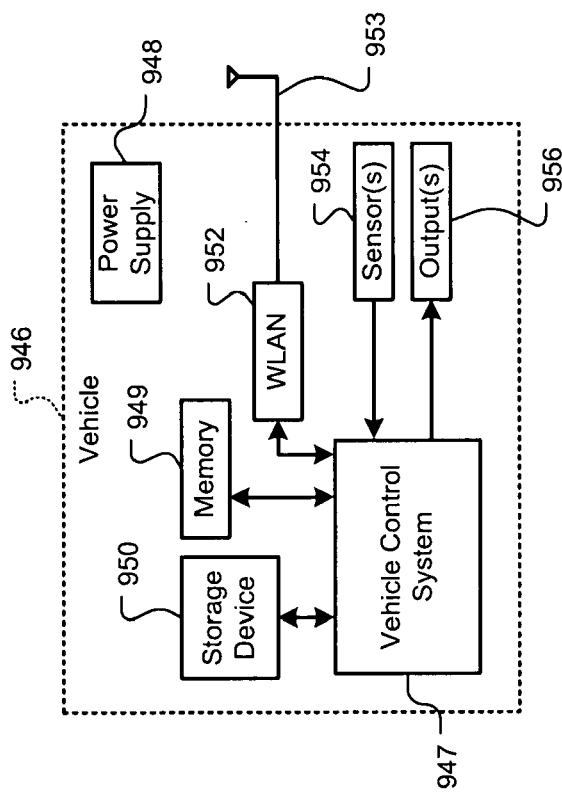
FIG. 9D is a functional block diagram of a vehicle control system.
Figure 9C:
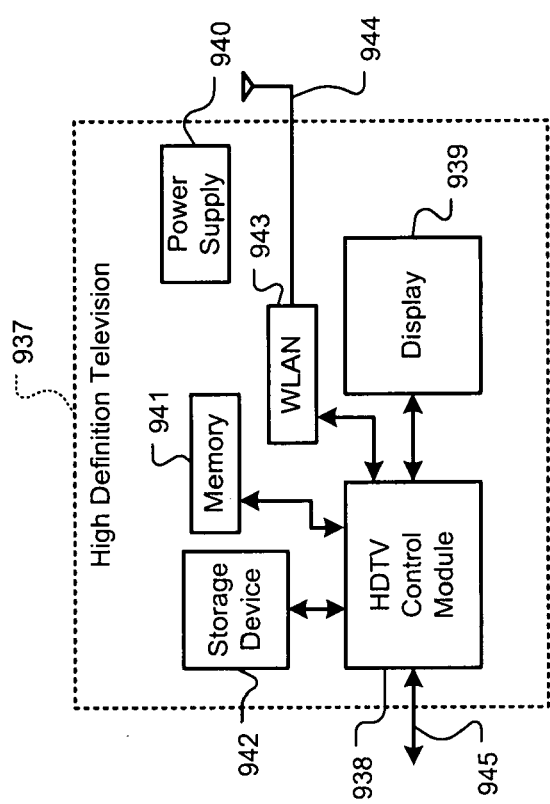
FIG. 9C is a functional block diagram of a high definition television.

Referring now to FIG. 9C, the teachings of the disclosure can be implemented in a HDTV control module 938 of a high definition television (HDTV) 937. The HDTV 937 includes the HDTV control module 938, a display 939, a power supply 940, memory 941, a storage device 942, a WLAN interface 943 and associated antenna 944, and an external interface 945.

The HDTV 937 can receive input signals from the WLAN interface 943 and/or the external interface 945, which sends and receives information via cable, broadband Internet, and/or satellite. The HDTV control module 938 may process the input signals, including encoding, decoding, filtering, and/or formatting, and generate output signals. The output signals may be communicated to one or more of the display 939, memory 941, the storage device 942, the WLAN interface 943, and the external interface 945.

Memory 941 may include random access memory (RAM) and/or nonvolatile memory such as flash memory, phase change memory, or multi-state memory, in which each memory cell has more than two states. The storage device 942 may include an optical storage drive, such as a DVD drive, and/or a hard disk drive (HDD). The HDTV control module 938 communicates externally via the WLAN interface 943 and/or the external interface 945. The power supply 940 provides power to the components of the HDTV 937.

Referring now to FIG. 9D, the teachings of the disclosure may be implemented in a vehicle control system 947 of a vehicle 946. The vehicle 946 may include the vehicle control system 947, a power supply 948, memory 949, a storage device 950, and a WLAN interface 952 and associated antenna 953. The vehicle control system 947 may be a powertrain control system, a body control system, an entertainment control system, an anti-lock braking system (ABS), a navigation system, a telematics system, a lane departure system, an adaptive cruise control system, etc.

The vehicle control system 947 may communicate with one or more sensors 954 and generate one or more output signals 956. The sensors 954 may include temperature sensors, acceleration sensors, pressure sensors, rotational sensors, airflow sensors, etc. The output signals 956 may control engine operating parameters, transmission operating parameters, suspension parameters, etc.

The power supply 948 provides power to the components of the vehicle 946. The vehicle control system 947 may store data in memory 949 and/or the storage device 950. Memory 949 may include random access memory (RAM) and/or nonvolatile memory such as flash memory, phase change memory, or multi-state memory, in which each memory cell has more than two states. The storage device 950 may include an optical storage drive, such as a DVD drive, and/or a hard disk drive (HDD). The vehicle control system 947 may communicate externally using the WLAN interface 952.

Figure 9F:
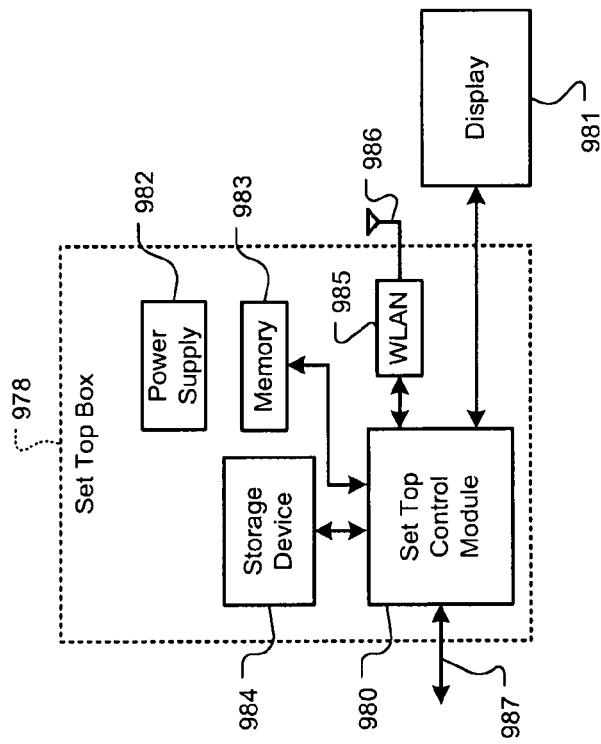
FIG. 9F is a functional block diagram of a set top box.
Figure 9E:
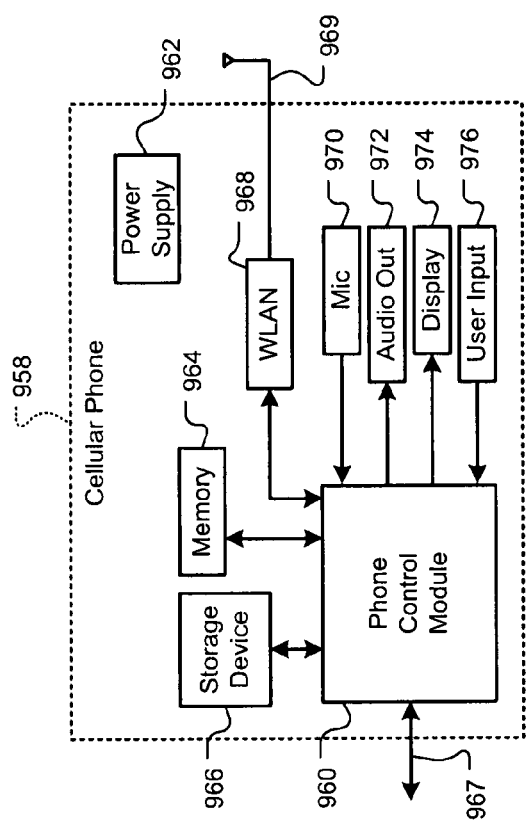
FIG. 9E is a functional block diagram of a cellular phone.

Referring now to FIG. 9E, the teachings of the disclosure can be implemented in a phone control module 960 of a cellular phone 958. The cellular phone 958 includes the phone control module 960, a power supply 962, memory 964, a storage device 966, and a cellular network interface 967. The cellular phone 958 may include a WLAN interface 968 and associated antenna 969, a microphone 970, an audio output 972 such as a speaker and/or output jack, a display 974, and a user input device 976 such as a keypad and/or pointing device.

The phone control module 960 may receive input signals from the cellular network interface 967, the WLAN interface 968, the microphone 970, and/or the user input device 976. The phone control module 960 may process signals, including encoding, decoding, filtering, and/or formatting, and generate output signals. The output signals may be communicated to one or more of memory 964, the storage device 966, the cellular network interface 967, the WLAN interface 968, and the audio output 972.

Memory 964 may include random access memory (RAM) and/or nonvolatile memory such as flash memory, phase change memory, or multi-state memory, in which each memory cell has more than two states. The storage device 966 may include an optical storage drive, such as a DVD drive, and/or a hard disk drive (HDD). The power supply 962 provides power to the components of the cellular phone 958.

Referring now to FIG. 9F, the teachings of the disclosure can be implemented in a set top control module 980 of a set top box 978. The set top box 978 includes the set top control module 980, a display 981, a power supply 982, memory 983, a storage device 984, and a WLAN interface 985 and associated antenna 986.

The set top control module 980 may receive input signals from the WLAN interface 985 and an external interface 987, which can send and receive information via cable, broadband Internet, and/or satellite. The set top control module 980 may process signals, including encoding, decoding, filtering, and/or formatting, and generate output signals. The output signals may include audio and/or video signals in standard and/or high definition formats. The output signals may be communicated to the WLAN interface 985 and/or to the display 981. The display 981 may include a television, a projector, and/or a monitor.

The power supply 982 provides power to the components of the set top box 978. Memory 983 may include random access memory (RAM) and/or nonvolatile memory such as flash memory, phase change memory, or multi-state memory, in which each memory cell has more than two states. The storage device 984 may include an optical storage drive, such as a DVD drive, and/or a hard disk drive (HDD).

Figure 9G:
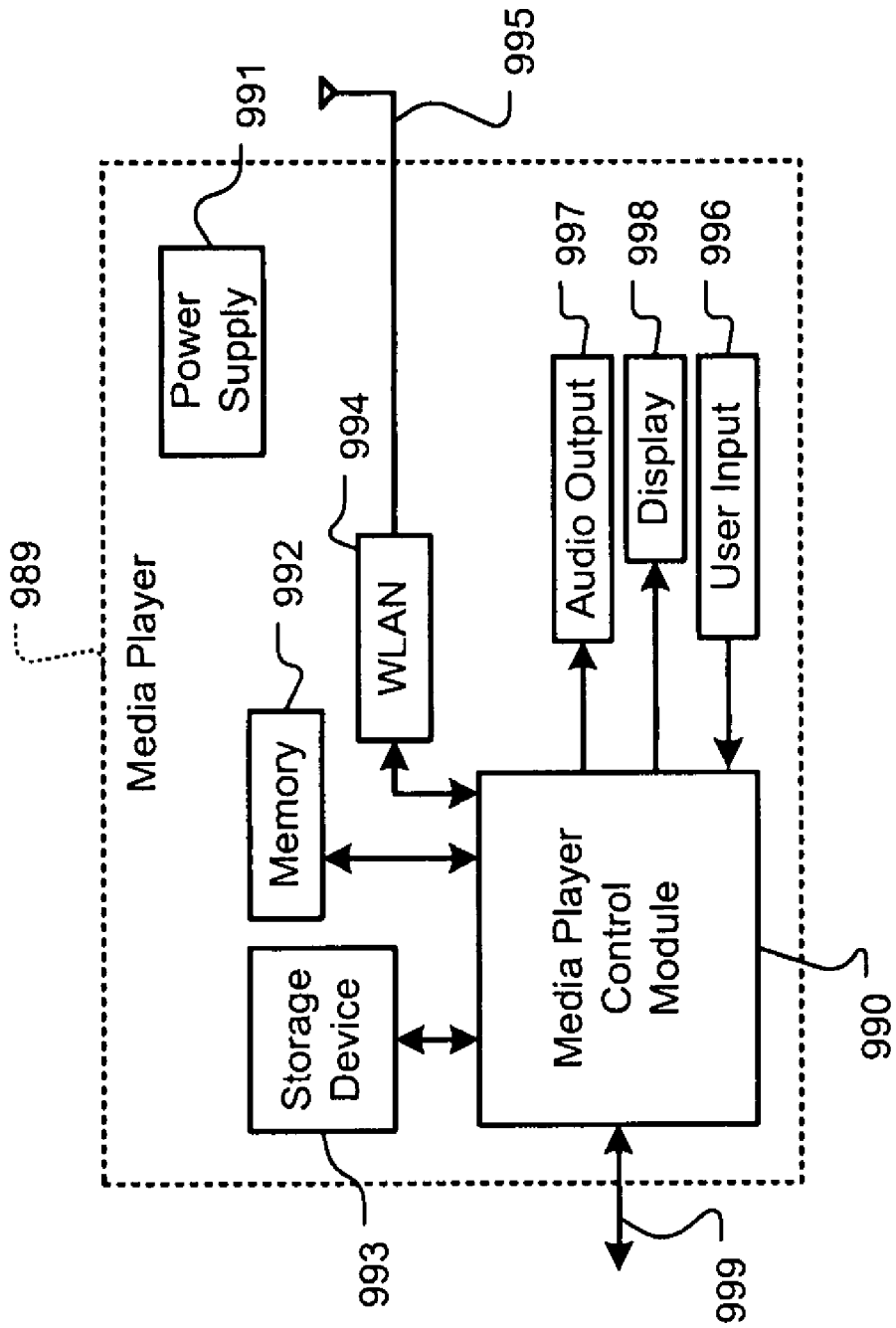
FIG. 9G is a functional block diagram of a media player.

Referring now to FIG. 9G, the teachings of the disclosure can be implemented in a media player control module 990 of a media player 989. The media player 989 may include the media player control module 990, a power supply 991, memory 992, a storage device 993, a WLAN interface 994 and associated antenna 995, and an external interface 999.

The media player control module 990 may receive input signals from the WLAN interface 994 and/or the external interface 999. The external interface 999 may include USB, infrared, and/or Ethernet. The input signals may include compressed audio and/or video, and may be compliant with the MP3 format. Additionally, the media player control module 990 may receive input from a user input 996 such as a keypad, touchpad, or individual buttons. The media player control module 990 may process input signals, including encoding, decoding, filtering, and/or formatting, and generate output signals.

The media player control module 990 may output audio signals to an audio output 997 and video signals to a display 998. The audio output 997 may include a speaker and/or an output jack. The display 998 may present a graphical user interface, which may include menus, icons, etc. The power supply 991 provides power to the components of the media player 989. Memory 992 may include random access memory (RAM) and/or nonvolatile memory such as flash memory, phase change memory, or multi-state memory, in which each memory cell has more than two states. The storage device 993 may include an optical storage drive, such as a DVD drive, and/or a hard disk drive (HDD).

What is claimed is:

1. A body switch system comprising:
a timing module that generates a plurality of clock signals;
an input node that receives an input signal;
an output node that transmits an output signal; and
a body switch circuit that selectively couples a body of a first transistor of a plurality of transistors to said output node and a body of a second transistor of said plurality of transistors to said input node based on said plurality of clock signals,
wherein said body switch circuit:
alternately couples said body of said first transistor to a ground potential and to a first one of said input node and said output node using a plurality of switches; and
alternately couples said body of said second transistor to a supply voltage and to a second one of said input node and said output node using said plurality of switches.

2. The body switch system of claim 1, wherein said first transistor includes a source and a drain,
wherein said source and said drain of said first transistor are coupled to said input node and said output node, respectively,
wherein said second transistor includes a source and a drain, and
wherein said source and said drain of said second transistor are coupled to said input node and said output node, respectively.

3. The body switch system of claim 1, wherein each of said plurality of switches and each of said plurality of transistors are operated based on said plurality of clock signals.

4. The body switch system of claim 3, wherein:
said plurality of switches includes a first and a second set of switches;
said plurality of transistors includes a first and a second set of primary transistors; and
wherein said first and second sets of primary transistors correspond to said first set of switches and said second set of switches, respectively.

5. The body switch system of claim 4, wherein each of said first and second set of switches, respectively, includes an input node switch, an output node switch, and ground switches.

6. The body switch system of claim 5, wherein said ground switches turn off before said output node switches and said input node switches turn on.

7. The body switch system of claim 6, wherein said first and second sets of primary transistors turn on after said input node switches and output node switches turn on.

8. The body switch system of claim 5, wherein said output node switches and said input node switches turn off before said ground switches turn on.

9. The body switch system of claim 8, wherein said first and second set of primary transistors turn off after said ground switches turn on.

10. The body switch system of claim 4, wherein said plurality of clock signals includes input clock signals and complementary input clock signals, and
wherein said timing module generates said complementary input clock signals based on said input clock signals.

11. The body switch system of claim 10, wherein said first set of primary transistors and said first set of switches are operated based on said input clock signals, and
wherein said second set of primary transistors and said second set of switches are operated based on said complementary input clock signals.

12. The body switch system of claim 1, wherein said plurality of clock signals are generated based on a reference clock signal, and
wherein said timing module delays each of said plurality of clock signals relative to said reference clock signal.

13. The body switch system of claim 1, wherein said plurality of transistors are one of a n-channel metal oxide semiconductor (NMOS) transistor and a p-channel metal oxide semiconductor (PMOS) transistor.

14. The body switch system of claim 1, wherein said plurality of switches are one of a re-channel metal oxide semiconductor (NMOS) transistor and a p-channel metal oxide semiconductor (PMOS) transistor.

15. A sample and hold system that includes the body switch system of claim 1.

16. A body switch system comprising:
    timing means for generating a plurality of clock signals;
    input means for receiving an input signal;
    output means for transmitting an output signal; and
    body switch means for selectively coupling a body of a first transistor of a plurality of transistors to said output means and a body of a second transistor of said plurality of transistors to said input means based on said plurality of clock signals,
    wherein said body switch means:
        alternately couples said body of said first transistor to a ground potential and to a first one of said input means and said output means using a plurality of switches; and
        alternately couples said body of said second transistor to a supply voltage and to a second one of said input means and said output means using said plurality of switches.

17. The body switch system of claim 16, wherein said first transistor includes a source and a drain,
    wherein said source and said drain of said first transistor are coupled to said input means and said output means, respectively,
    wherein said second transistor includes a source and a drain, and
    wherein said source and said drain of said second transistor are coupled to said input means and said output means, respectively.

18. The body switch system of claim 16, wherein each of said plurality of switches and each of said plurality of transistors are operated based on said plurality of clock signals.

19. The body switch system of claim 18, wherein:
    said plurality of switches includes a first and a second set of switches;
    said plurality of transistors includes a first and a second set of primary transistors that; and
    said first and second sets of primary transistors correspond to said first set of switches and said second set of switches, respectively.

20. The body switch system of claim 19, wherein each of said first and second set of switches, respectively, includes an input node switch, an output node switch, and ground switches.

21. The body switch system of claim 20, wherein said ground switches turn off before said output node switches and said input node switches turn on.

22. The body switch system of claim 21, wherein said first and second sets of primary transistors turn on after said input node switches and output node switches turn on.

23. The body switch system of claim 20, wherein said output node switches and said input node switches turn off before said ground switches turn on.

24. The body switch system of claim 23, wherein said first and second set of primary transistors turn off after said ground switches turn on.

25. The body switch system of claim 19, wherein said plurality of clock signals includes input clock signals and complementary input clock signals, and
    wherein said timing means generates said complementary input clock signals based on said input clock signals.

26. The body switch system of claim 25, wherein said first set of primary transistors and said first set of switches are operated based on said input clock signals, and
    wherein said second set of primary transistors and said second set of switches are operated based on said complementary input clock signals.

27. The body switch system of claim 16, wherein said plurality of clock signals are generated based on a reference clock signal, and
    wherein said timing means delays each of said plurality of clock signals relative to said reference clock signal.

28. The body switch system of claim 16, wherein said plurality of transistors are one of a re-channel metal oxide semiconductor (NMOS) transistor and a p-channel metal oxide semiconductor (PMOS) transistor.

29. The body switch system of claim 16, wherein said plurality of switches are one of a re-channel metal oxide semiconductor (NMOS) transistor and a p-channel metal oxide semiconductor (PMOS) transistor.

30. A sample and hold system that includes the body switch system of claim 16.

31. A body switch method comprising:
    generating a plurality of clock signals;
    receiving an input signal;
    transmitting an output signal; selectively coupling a body of a first transistor of a plurality of transistors to an output node and a body of a second transistor of said plurality of transistors to said input node based on said plurality of clock signals;
    alternately coupling said body of said first transistor to a ground potential and to a first one of said input node and said output node using a plurality of switches; and
    alternately coupling said body of said second transistor to a supply voltage and to a second one of said input node and said output node using said plurality of switches.

32. The body switch method of claim 31, wherein said first transistor includes a source and a drain,
    wherein said source and said drain of said first transistor are coupled to said input node and said output node, respectively,
    wherein said second transistor includes a source and a drain, and
    wherein said source and said drain of said second transistor are coupled to said input node and said output node, respectively.

33. The body switch method of claim 31, wherein each of said plurality of switches and each of said plurality of transistors are operated based on said plurality of clock signals.

34. The body switch method of claim 33, wherein:
    said plurality of switches includes a first and a second set of switches;
    said plurality of transistors includes a first and a second set of primary transistors; and
    said first and second set of primary transistors correspond to said first set of switches and said second set of switches, respectively.

35. The body switch method of claim 34, wherein each of said first and second set of switches, respectively, includes an input node switch, an output node switch, and ground switches.

36. The body switch method of claim 35, wherein said ground switches turn off before said output node switches and said input node switches turn on.

37. The body switch method of claim 36, wherein said first and second sets of primary transistors turn on after said input node switches and output node switches turn on.

38. The body switch method of claim 35, wherein said output node switches and said input node switches turn off before said ground switches turn on.

39. The body switch method of claim 38, wherein said first and second set of primary transistors turn off after said ground switches turn on.

40. The body switch method of claim 34, wherein said plurality of clock signals includes input clock signals and complementary input clock signals, and
   wherein said complementary input clock signals are generated based on said input clock signals.

41. The body switch method of claim 40, wherein said first set of primary transistors and said first set of switches are operated based on said input clock signals, and
   wherein said second set of primary transistors and said second set of switches are operated based on said complementary input clock signals.

42. The body switch method of claim 31, wherein said plurality of clock signals are generated based on a reference clock signal, and
   wherein each of said plurality of clock signals is delayed relative to said reference clock signal.

43. The body switch method of claim 31, wherein said plurality of transistors are one of a re-channel metal oxide semiconductor (NMOS) transistor and a p-channel metal oxide semiconductor (PMOS) transistor.

44. The body switch method of claim 31, wherein said plurality of switches are one of a re-channel metal oxide semiconductor (NMOS) transistor and a p-channel metal oxide semiconductor (PMOS) transistor.

45. A sample and hold method that includes the body switch method of claim 31.

46. A body switch system comprising:
   a timing module that generates a plurality of clock signals;
   an input node that receives an input signal;
   an output node that transmits an output signal; and
   a body switch circuit that selectively couples a body of a first transistor of a plurality of transistors to said output node and a body of a second transistor of said plurality of transistors to said input node based on said plurality of clock signals,
   wherein said body switch circuit selectively couples said body of said first transistor to one of said output node and a reference potential, and
   wherein said body switch circuit selectively couples said body of said second transistor to one of said input node and said reference potential.

47. The body switch system of claim 46, wherein said reference potential is one of a ground potential and a supply voltage potential.

* * * * *